(12) United States Patent
Setiadi et al.

(10) Patent No.: US 8,026,732 B2
(45) Date of Patent: Sep. 27, 2011

(54) PROBE WITH BI-DIRECTIONAL ELECTROSTATIC ACTUATION

(75) Inventors: Dadi Setiadi, Edina, MN (US); Wayne Bonin, North Oaks, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 254 days.

(21) Appl. No.: 12/272,128

(22) Filed: Nov. 17, 2008

(65) Prior Publication Data
US 2010/0123470 A1    May 20, 2010

(51) Int. Cl.
*G01R 31/20* (2006.01)
(52) U.S. Cl. ................................. 324/754.01
(58) Field of Classification Search ........... 324/765, 324/754, 761–762, 158.1, 760, 757, 758, 324/754.01–754.14, 762.01–762.09
See application file for complete search history.

(56) References Cited

U.S. PATENT DOCUMENTS

| | | | |
|---|---|---|---|
| 5,416,429 A | 5/1995 | McQuade | |
| 6,084,420 A * | 7/2000 | Chee | 324/755.06 |
| 7,167,434 B2 | 1/2007 | Champion | |
| 7,221,146 B2 * | 5/2007 | Dunklee et al. | 324/754.01 |
| 7,265,937 B1 | 9/2007 | Erden | |
| 7,310,298 B2 | 12/2007 | Hilton | |
| 2005/0128927 A1 | 6/2005 | Milligan | |
| 2006/0023606 A1 | 2/2006 | Lutwyche | |
| 2006/0187803 A1 | 8/2006 | Baechtold | |
| 2007/0121477 A1 | 5/2007 | Belov | |
| 2008/0089211 A1 | 4/2008 | Chu | |

OTHER PUBLICATIONS

U.S. Appl. No. 11/933,729, filed Nov. 1, 2007; Inventor: Juli Lee.
U.S. Appl. No. 12/119,717, filed May 13, 2008; Inventor: Wayne Bonin.

* cited by examiner

*Primary Examiner* — Huy Q Phan
*Assistant Examiner* — Tung X Nguyen
(74) *Attorney, Agent, or Firm* — Campbell Nelson Whipps LLC

(57) ABSTRACT

A probe system that has a probe body comprising at least three arms extending from a central region and a probe tip centrally located on the probe body in the central region. A substrate is proximate the probe body opposite the probe tip. A first electrode is positioned to provide a centrally positioned voltage across the probe body and the substrate and a second electrode set is positioned radially outward from the first electrode, to provide an outer voltage across at least one of the at least three arms and the substrate. The probe structure may have, for example, four arms. Methods of actuating the probe tip are provided.

11 Claims, 5 Drawing Sheets

PROBE WITH BI-DIRECTIONAL ELECTROSTATIC ACTUATION

BACKGROUND

With improvements in nanotechnology, new types of devices are being developed. One class of these devices utilizes one or more microscopic scanning probes to interact with a medium or substrate. These scanning probes can interact with the medium or substrate in different applications including digital storage applications where data is stored on the medium in various ways, microscopic imaging applications where the probe is used to scan a sample, or other applications suitable for use with a scanning probe.

In order to facilitate these scanning probe applications, the probe tip needs to be moved or actuated, for example to bring into operational contact with the medium or substrate. The invention of the present disclosure provides a probe design that improves actuation of the probe tip.

BRIEF SUMMARY

The present disclosure is directed to probe systems that utilize bi-directional actuation using an electrostatic force. The probe system has a first electrode and a second electrode set that provide actuation voltage potential in relation to a common ground. In some embodiments, the electrodes are on a probe structure and a substrate provides the ground, whereas in other embodiments, the electrodes are on the substrate and the probe structure provides the ground. The first electrode and the second electrode set are configured to selectively displace the probe structure and actuate a probe tip on the probe structure.

In one exemplary embodiment, this disclosure provides a probe system that has a probe body comprising at least three arms extending from a central region and a probe tip centrally located on the probe body in the central region. A substrate is proximate the probe body opposite the probe tip. A first electrode is positioned to provide a centrally positioned voltage across the probe body and the substrate and a second electrode set is positioned radially outward from the first electrode, to provide an outer voltage across at least one of the at least three arms and the substrate.

In another exemplary embodiment, this disclosure provides a method of actuating a probe tip. The method includes providing a probe structure having at least three arms extending from a central region and a probe tip centrally located in the central region. The probe tip can be moved toward a medium by applying a first voltage to a first electrode to provide voltage across the central region and an adjacent substrate. The probe tip can be moved away from the medium by applying a second voltage to a second electrode set to provide voltage across at least one of the at least three arms and the adjacent substrate.

These and various other features and advantages will be apparent from a reading of the following detailed description.

BRIEF DESCRIPTION OF THE DRAWING

The invention may be more completely understood in consideration of the following detailed description of various embodiments of the invention in connection with the accompanying drawing, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense.

The present disclosure is directed to probe systems that include a probe structure having a probe body supporting a probe tip, that utilize electrostatic force to actuate the probe tip from a first position to at least a second, displaced position. The probe system includes a substrate corresponding to the probe structure. In the first position, the probe tip is in operational contact with a sample (e.g., within about 1 nm), such as an electronic storage medium, in the second position the probe tip is spaced away from the sample. For the probe tip to be in "operational contact" with the sample means that the probe tip is sufficiently near to determine data, for example, to physically detect a dent or lack of a dent, to measure the resistance of the sample, to measure the magnetization or polarization of the sample, etc. Depending on the sample and the mode by which the data is stored, the probe tip may be in physical contact with the sample, may be within 1 nm, may be within 10 nm, or the like. Use of a folded beam or supported-beam probe body is desired because it provides a linear spring force over a large displacement range while resisting tilting and lateral motion of the probe tip. The probe system has a first electrode and a second electrode set that provide actuation voltage potential in relation to a common ground to actuate the probe tip. In some embodiments, the electrodes are on the probe structure and the substrate provides the ground, whereas in other embodiments, the electrodes are on the substrate and the probe structure provides the ground.

While the present invention is not so limited, an appreciation of various aspects of the invention will be gained through the discussion provided below.

Figure 1:
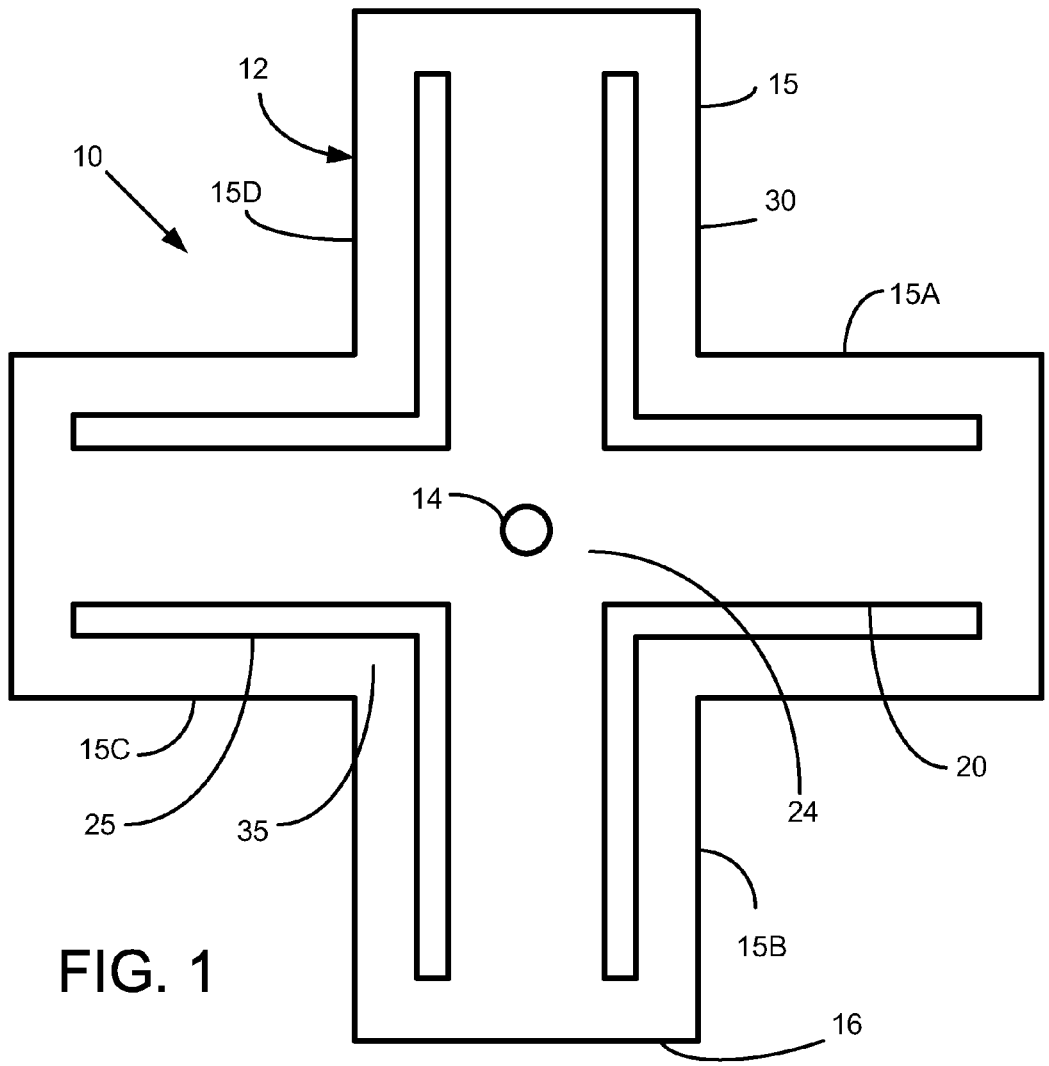
FIG. 1 is a schematic top view of a probe structure.
Figure 2:
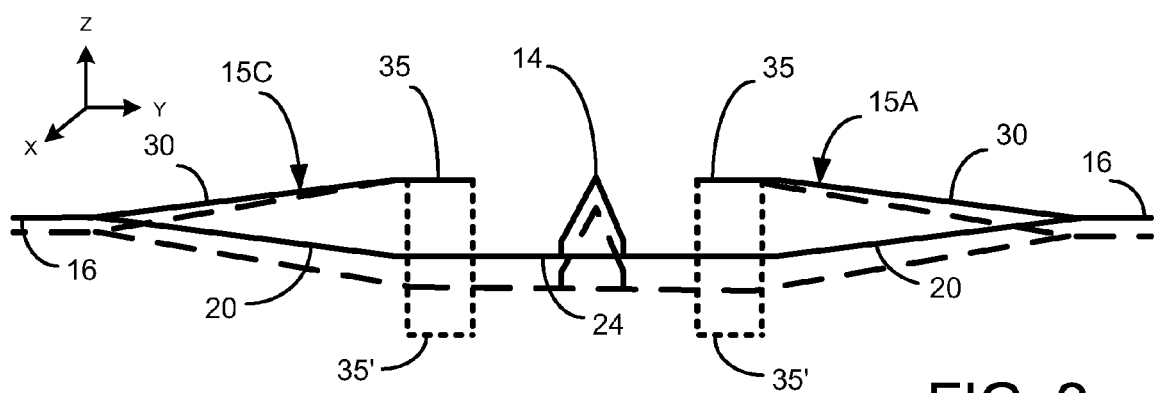
FIG. 2 is a side view of the probe structure of FIG. 1, showing the probe tip in a first position and in a second position.

Referring to FIG. 1 and to FIG. 2, a first embodiment of a suitable probe body is schematically illustrated as probe structure 10. Probe structure 10 has a support body 12 for supporting a centrally located probe tip 14. Probe tip 14 is configured to operably engage a sample material, e.g., an electronic storage medium, and detect information, such as, for example, indents in the sample, electrically conductive or magnetic bumps on the sample, a resistance or voltage distribution on the sample, or a magnetic charge on the sample. In some embodiments, probe tip 14 is configured to form indents or perturbations in the sample. Probe tip 14 is usually designed to be mechanically hard (to resist wear), to be chemically compatible with the sample (e.g., to avoid sample or probe tip degradation), and may have high electrical conductivity in either its bulk or in a specific portion, such as an embedded electrode. In some embodiments, probe structure 10 is very small (on the order of micrometers, nanometers, or even smaller) and is built using nanotechnology techniques (e.g., thin film or MEMS techniques).

Support body 12 has a plurality of radially extending arms 15; in this embodiment, body 12 has four arms 15A, 15B, 15C, 15D. Some embodiments of suitable probe bodies will have at least three radially extending arms. Each radially extending arm 15 has a distal end 16.

Support body 12 includes an inner beam structure 20 surrounded by an outer support 30. Inner beam structure 20 is fixed to outer support 30 at each distal end 16 of each arm 15. The inner beam structures 20 of each arm 15 intersect at a central intersection region 24, which supports probe tip 14. For support body 12, inner beam structure 20 and outer support 30 of each arm 15 extend parallel to each other. Support body 12 may be referred to as a folded beam, because inner beam structure 20 of an arm 15 folds back to form its outer support 30.

Inner beam structure 20 and outer support 30 are connected together only at distal ends 16, so that the remainder of inner beam structure 20 and outer support 30 are not fixed or connected together. For support body 12, a gap 25 extends between inner beam structure 20 and outer support 30. Gap 25 allows for relative vertical movement between inner beam structure 20 and outer support 30. In alternate embodiments, no gap may exist, but rather the inner beam structure and outer support are unconnected, allowing for relative vertical movement.

Support body 12 is made of a material to allow each of inner beam structure 20 and outer support 30 to flex in the vertical direction (along the Z-axis), towards and away from a sample. In some embodiments, inner beam structure 20 and outer support 30 are made from a single continuous piece of material. See FIG. 1, where it can be seen that inner beam structure 20 and outer support 30 are continuous and contiguous (e.g., adjacent and connected).

Neighboring arms 15 (e.g., arm 15B and arm 15C) have their inner beam structure 20 meet at central intersection region 24 and have their outer support 30 meet at outer intersection corner region 35. Outer intersection region 35 is the portion of outer support 30 closest to probe tip 14.

Probe structure 10 is fixedly attached or supported to a substrate at the region of outer support 30 proximate probe tip 14, e.g., at outer intersection region 35. Inner beam structure 20 and that portion of outer support 30 not fixedly attached are available for displacement from a first position to a second position.

In FIG. 2, two opposite arms 15A, 15C, in side view, are shown in both a first displaced position and a second displaced position (shown in phantom). In the first position, probe tip 14 virtually contacts a sample positioned above tip 14. Probe structure 10 is fixedly supported at outer intersection regions 35, for example, by supporting mechanisms 35' illustrated in phantom. Center intersection region 24, inner beam structure 20 and that portion of outer support 30 not fixedly attached are displaced from a planar position to a first displaced position and to a second displaced position. Distal end 16, where inner beam structure 20 folds back to outer support 30, remains parallel to supported outer intersection region 35. The deflection of inner beam structure 20 and outer support 30 from planar to the first position and to the second position will be a smooth transition, providing a linear spring force over a large Z-direction displacement distance.

Figure 3:
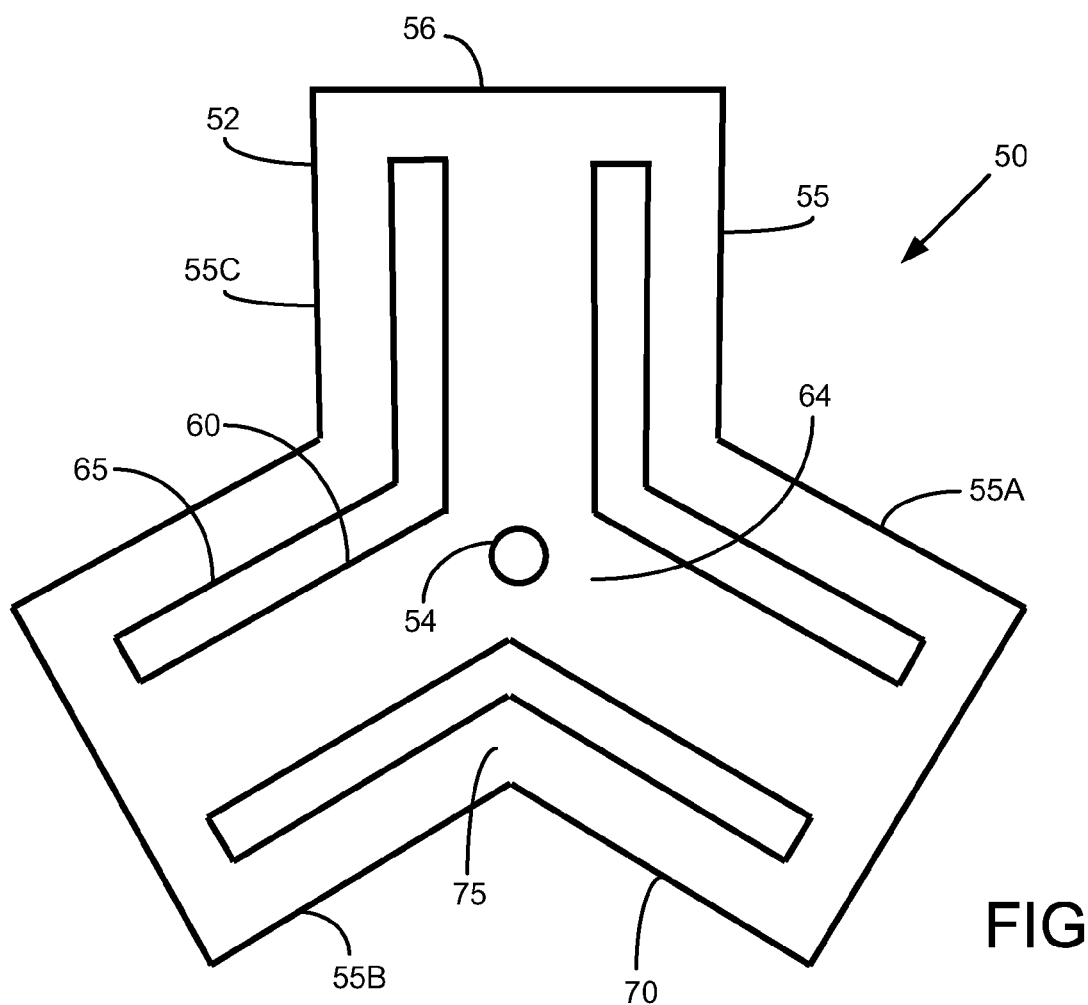
FIG. 3 is a schematic top view of an alternate embodiment of a probe structure.

Another embodiment of a supported-beam probe body is illustrated in FIG. 3 as probe structure 50. The various elements of probe structure 50 have the same properties and qualities as the respective elements of probe structure 10 unless otherwise indicated.

Probe structure 50 has a support body 52 with a centrally located probe tip 54. Support body 52 has a plurality of radially extending arms 55; in this embodiment, body 52 has three arms 55A, 55B, 55C. Each radially extending arm 55 has a distal end 56. Support body 52 includes an inner beam structure 60 surrounded by an outer support 70. Inner beam structure 60 is fixed to outer support 70 at each distal end 56 of each arm 55. The inner beam structures 60 of each arm 55 intersect at a central intersection region 64, which supports probe tip 54. For support body 52, inner beam structure 60 and outer support 70 of each arm 55 extend parallel to each other.

Support body 52 may be referred to as a folded beam, because inner beam structure 60 of an arm 55 folds back to form its outer support 70. Inner beam structure 60 and outer support 70 are connected together only at distal ends 56, so that the remainder of inner beam structure 60 and outer support 70 are not fixed or connected together. For support body 52, a gap 65 extends between inner beam structure 60 and outer support 70. Gap 65 allows for relative vertical movement between inner beam structure 60 and outer support 70.

Support body 52 is made of a material to allow each of inner beam structure 60 and outer support 70 to flex. In some embodiments, inner beam structure 60 and outer support 70 are made from a single continuous piece of material; inner beam structure 60 and outer support 70 are continuous and contiguous (e.g., adjacent and connected).

Neighboring arms 55 (e.g., arm 55A and arm 55B) have their inner beam structure 60 meet at central intersection region 64 and have their outer support 70 meet at outer intersection region 75. Outer intersection region 75 is the portion of outer support 70 closest to probe tip 54. Probe structure 50 is fixedly attached or supported to a structure (e.g., a substrate) at the region of outer support 70 proximate probe tip 54, i.e., at outer intersection region 75. Inner beam structure 60 and that portion of outer support 70 not fixedly attached are available for displacement from the planar first position.

The supported-beam probe bodies described above and other embodiments thereof provide a linear spring force over a large displacement range, due to the folded nature of the structure. Having the inner beam structure hingedly connected to the outer support provides a desirable spring stiffness. The supported-beam probe bodies and structures described above and other embodiments thereof also resist probe tip tilting and lateral motion of the probe tip that result from side load forces on the probe tip, for example, due to the at least three supported-beam arms. Of course, embodiments not described above would also have the benefits of those described embodiments. For example, alternate suitable embodiments may have five, six, eight, etc. arms. In some embodiments, the inner beam structure and outer support of each arm may not be parallel to each other.

Figure 4:
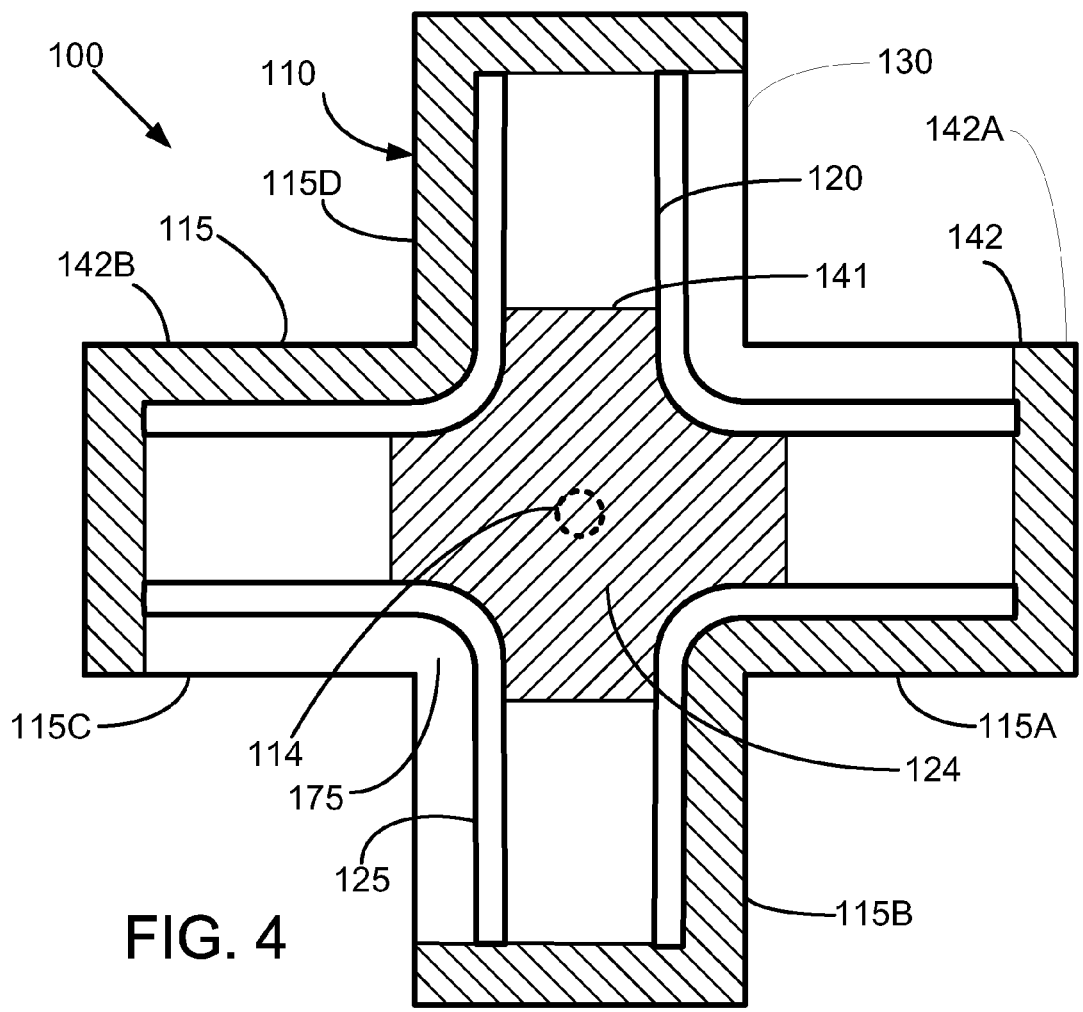
FIG. 4 is a bottom view of a probe structure showing a central electrode and two outer electrodes.
Figure 5A:
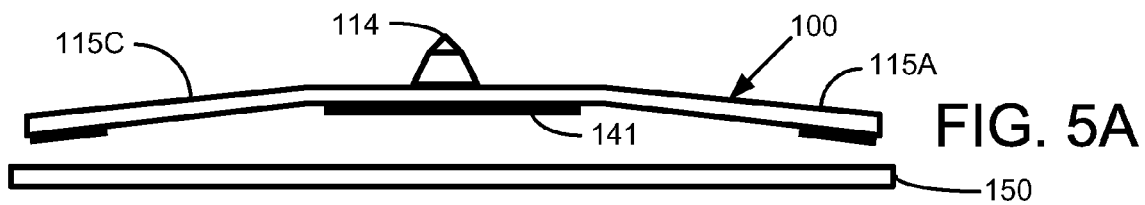
FIG. 5A is a side view of a probe system including the probe structure of FIG. 4 showing the probe tip actuated by outer electrodes.
Figure 5B:
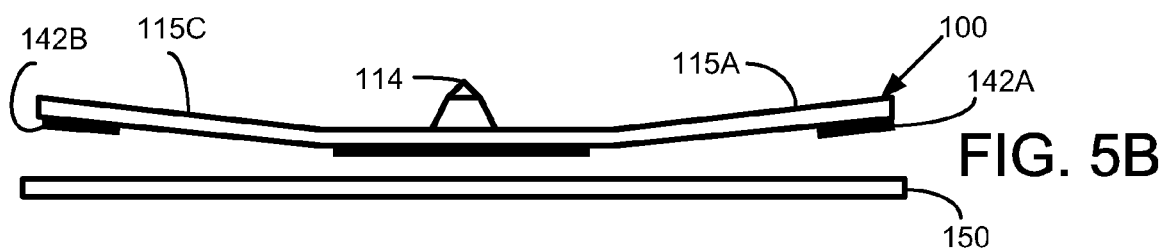
FIG. 5B is a side view showing the probe tip actuated by the center electrode.

A probe structure, utilizing a supported-beam probe body is illustrated in FIG. 4. Probe structure 100 has a probe body 110 similar to probe structure 10 of FIGS. 1 and 2, except that the gap between the inner beam structure and the outer support has radiused corners at the outer intersection regions for body 110. FIG. 4 is a bottom view of structure 100; thus, the probe tip (illustrated in phantom as probe tip 114) is on the opposite side of that illustrated. Probe structure 100, when combined with a substrate, as illustrated in FIGS. 5A and 5B, form a probe system.

As stated above, probe structure 100 includes a probe body 110 with a centrally located probe tip 114. Probe body 110 has a plurality of radially extending arms 115, in this embodiment, four arms 115A, 115B, 115C, 1115D. Probe body 110 includes an inner beam body 120 surrounded by and fixed to an outer support 130. A gap 125 extends between inner beam body 120 and outer support 130. The inner beam structures 120 of each arm 115 intersect at a central intersection region 124, which supports probe tip 114. The outer supports 130 of adjacent arms 115 intersect at an outer corner 175, which provides location for a supporting mechanism for probe body 110.

Probe structure 100 has a first electrode 141 that is centrally located on probe body 110, at least partially present in central intersection region 124. In some embodiments, first electrode 141 occupies all of central intersection region 124 and may extend farther than region 124, whereas in other embodiments, first electrode 141 may occupy only a portion of central intersection region 124. First electrode 141 is preferably symmetrical in the direction of each of arms 115.

Probe structure 100 also has a second electrode set 142, which in this illustrated embodiment includes a first electrode pad 142A and a second electrode pad 142B. Second element set 142 is radially external to first electrode 141. First electrode pad 142A is present on arms 115A and 115B and second electrode pad 142B is present on arms 115C and 115D. In this illustrated embodiment, electrode pads 142A, 142B occupy the area of arms 115A, 115B, 115C, 115D distal to gap 125, except for the area that connects two adjacent arms. In other embodiments, electrode pads 142A, 142B may extend farther toward central intersection region 124. In use, a voltage may be applied to each of electrode pads 142A, 142B individually, to actuate arm 115A/115B, 115C/115D separately, if desired. Actuation of arm 115A/115B separate from arm 115C/115D may be desired, for example, if a misalignment of probe tip 114 exists, or if there is a no-complete contact of probe tip 114 to the sample.

A probe system is illustrated in FIGS. 5A and 5B, where two opposite arms 115A, 115C from probe structure 100 are shown, in side view, in both a first position and a second position. The probe system includes probe structure 100 and a grounded substrate 150. Probe tip 114 is actuated, either up or down, by applying a voltage across either first electrode 141 or second electrode set 142. In the first position, FIG. 5A, probe tip 114 is actuated up by pulling down on second electrode set 142 so that probe tip 114 virtually contacts a sample positioned above tip 114. In the second position, FIG. 5B, probe tip 114 is actuated down, toward substrate 150 and away from the sample, by pulling down on first electrode 141.

To increase the capacitive attractiveness and/or repulsion between probe structure 100 and grounded substrate 150, probe structure 100 may include additional electrodes on the top side of probe body 110 (i.e., on the side supporting probe tip 114).

Probe body 110 is formed from a material to allow arms 115 to flex. Examples of suitable materials include SiN, $SiO_2$, and SiC. Electrodes 141, 142 may be any suitable conducting material; examples of materials include Cr, Cu, Al, Pt, and C (e.g., DLC or diamond like carbon). Electrodes 141, 142 may be deposited onto probe body 110, for example, by CVD, PVD, and the like.

Figure 6:
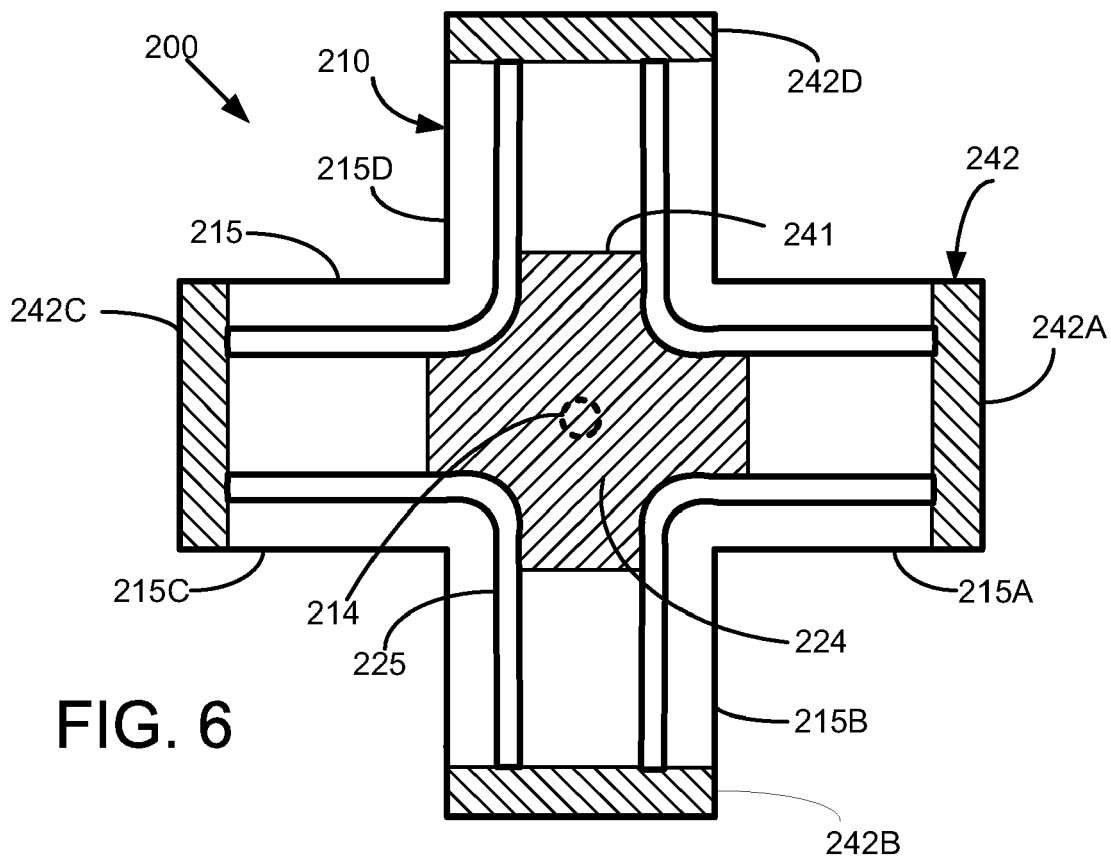
FIG. 6 is a bottom view of an alternate probe structure showing a central electrode and two outer electrodes.
Figure 7:
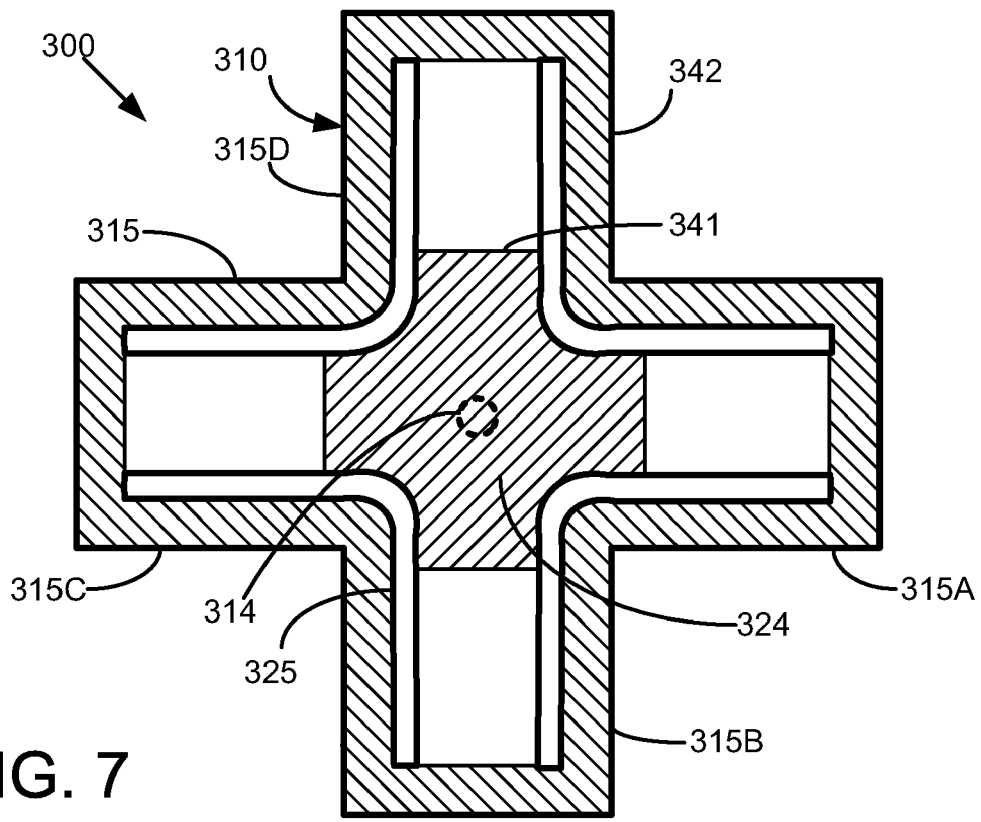
FIG. 7 is a bottom view of another alternate probe structure showing a central electrode and two outer electrodes.

Alternate probe structures, having a first centrally positioned electrode and a second electrode set, are illustrated in FIGS. 6 and 7. The probe structures have similar features as probe structure 100 described above, unless indicated otherwise.

In FIG. 6, probe structure 200 includes a probe body 210 with a centrally located probe tip 214 and a plurality of radially extending arms 215, in this embodiment, four arms 215A, 215B, 215C, 215D, which intersect at central intersection region 224. A gap 225 divides inner and outer beam structures, and extends within and connects adjacent arms 215.

Probe structure 200 has a first electrode 241 that is centrally located on probe body 210, at least partially present in central intersection region 224. First electrode 241 is preferably symmetrical in the direction of each of arms 215. Probe structure 200 also has a second electrode set 242 radially external to first electrode 241, which in this illustrated embodiment includes a first electrode pad 242A, a second electrode pad 242B, a third electrode pad 242C, and a fourth electrode pad 242D, each which is present on a respective arm 215. In this illustrated embodiment, electrode pads 242A, 242B, 242C, 242D occupy the area of arms 215A, 215B, 215C, 215D distal to gap 225. In use, a voltage may be applied to each of electrode pads 242A, 242B, 242C, 242D individually, to actuate each arm 215A, 215B, 215C, 215D separately, if desired.

In FIG. 7, probe structure 300 includes a probe body 310 with a centrally located probe tip 314 and a plurality of radially extending arms 315, in this embodiment, four arms 315A, 315B, 315C, 315D, which intersect at central intersection region 324. A gap 325 extends within and connects adjacent arms 315.

Probe structure 300 has a first electrode 341 that is centrally located on probe body 310. Probe structure 300 also has a second electrode set 342 radially external to first electrode 341, which in this illustrated embodiment includes one electrode pad, which is present on each arm 315. In this illustrated embodiment, second electrode set 342, as one electrode pad, occupies the area of arms 315A, 315B, 315C, 315D distal to gap 325 and the area between gap 325 and the external perimeter of probe body 310. In use, a voltage applied to second electrode set 342 actuates each arm 315A, 315B, 315C, 315D simultaneously.

Figure 8:
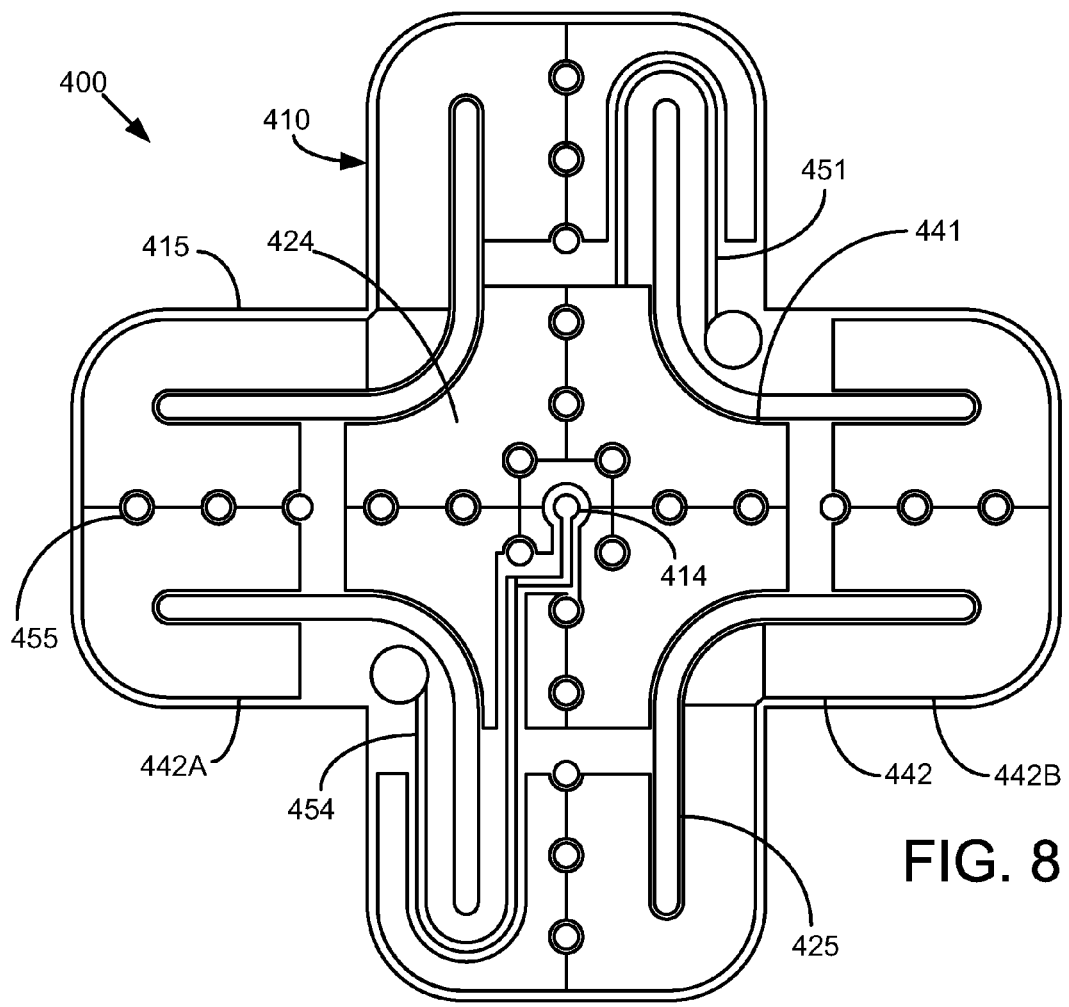
FIG. 8 is a detailed bottom view of a probe structure showing a central electrode and two outer electrodes.

Probe structures 100, 200, 300 described above and illustrated in FIGS. 4, 6 and 7, respectively, provide basic layouts of the first electrodes and second electrode sets. In some embodiments, the arrangement of the electrodes and other features of the probe structure may be very detailed and/or complicated. See, for example, FIG. 8, which illustrates a probe structure 400.

Probe structure 400 includes a probe body 410 with a centrally located probe tip 414 and a plurality of radially extending arms 415, in this embodiment, four arms, which intersect at central intersection region 424. A gap 425 extends within and connects adjacent arms 415. Probe structure 400 has a first centrally located electrode 441 in central intersection region 424. Probe structure 400 also has a second electrode set 442, which in this illustrated embodiment includes a first electrode pad 442A and a second electrode pad 442B, each which extends over two arms 415. Each electrode pad 442A, 442B occupies the area distal to gap 425, connects two adjacent arms, and extends toward central intersection region 424 between gaps 425. Also present on probe body 410 is a probe tip lead 454 and a first electrode lead 451, which connects first electrode 441 to a voltage source. Apertures 455 are present through body 410, in this embodiment; apertures 455 may facilitate movement of body 410, may provide flexibility to body 410, or may facilitate manufacture (e.g., allow access to the underside of body 410 for removal of temporary structures formed during manufacture) of various elements on body 410.

Figure 9A:
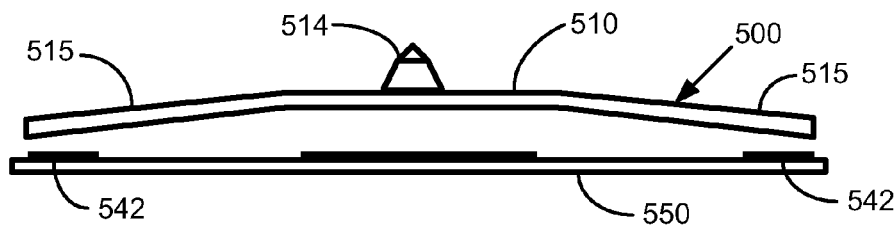
FIG. 9A is a side view of a probe system having the electrodes on a substrate rather than on the probe structure, FIG. 9A showing the probe tip actuated by the outer electrodes.
Figure 9B:
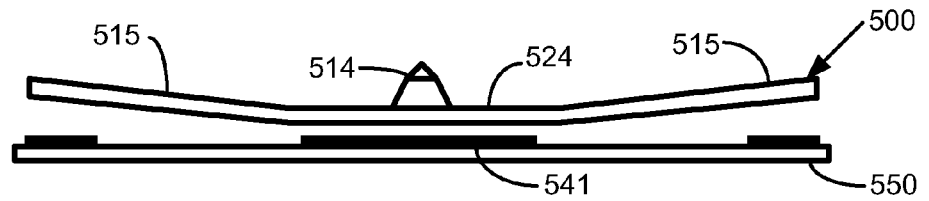
FIG. 9B is a side view showing the probe tip actuated by the center electrode.

The previously described probe systems have a first electrode and a second electrode set on the probe structure that provide actuation voltage potential in relation to a common grounded substrate to actuate the probe tip. FIGS. 9A and 9B illustrate, in side view, a probe system having a first electrode and a second electrode set on a fixed substrate and a moveable probe structure is grounded. The probe system has a probe structure 500 having a body 510 with a probe tip 514 supported thereon. Body 510 has a plurality of arms 515 extending from a central region 524. Probe structure 500 is grounded. Fixed proximate to probe structure 500 is a substrate 550, which has a first electrode 541 and a second electrode set 542 positioned thereon. First electrode 541 is centrally located in relation to probe structure 500 and probe tip 514. Probe tip 514 is actuated, either up or down, by applying a voltage across either first electrode 541 or second electrode set 542.

In the first position, FIG. 9A, probe tip 114 is actuated up by pulling down with second electrode set 542 so that probe tip 514 virtually contacts a sample positioned above tip 514. In the second position, FIG. 9B, probe tip 514 is actuated down, toward substrate 550 and away from the sample, by actuating and pulling down with first electrode 541.

Such supported-beam structures are suitable for various uses. For example, the structures are particularly suited for use with a probe or other detection device positioned in the central intersection region of the arms. Devices that include probes include electronic media devices (e.g., electronic storage devices, read-write devices, information processing devices) and microscopes. Scanning probe microscopes (SPMs) typically characterize the surface of a sample down to atomic dimensions by monitoring the interaction between the sample and a probe tip on the probe. By providing relative scanning movement between the tip and the sample, surface characteristic data can be acquired over a particular region of the sample, and a corresponding map of the sample can be generated. The use of supported-beam structures according to this disclosure may have additional applications.

Thus, embodiments of the PROBE WITH BI-DIRECTIONAL ELECTROSTATIC ACTUATION are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A probe system comprising:
    a probe body comprising four arms equally spaced apart and extending from the central region;
    a probe tip centrally located on the probe body in the central region;
    a substrate proximate the probe body opposite the probe tip;
    a supporting mechanism for the probe body between the central region and the at least four arms;
    a first electrode positioned to provide a centrally positioned voltage across the probe body and the substrate; and
    a second electrode set positioned on each of the four arms, to provide an outer voltage across at least one of the at least four arms and the substrate.

2. The probe system of claim 1 wherein the second electrode set comprises a first electrode pad and a second electrode pad, wherein the first electrode pad is present on first and second arms and the second electrode pad is present on third and fourth arms.

3. The probe system of claim 1 wherein the second electrode set comprises a first electrode pad, a second electrode pad, a third electrode pad and a fourth electrode pad, wherein the first electrode pad is present on a first arm, the second electrode pad is present on a second arm, the third electrode pad is present on a third arm, and the fourth electrode pad is present on a fourth arm.

4. The probe system of claim 1 wherein the probe body is a supported-beam body comprising an inner beam structure surrounded by an outer support, the inner beam structure pivotally connected to the outer support, the inner beam structure having a central region and the outer support having outer corner regions, the outer corner regions providing attachment to the supporting mechanism for the probe body.

5. The probe system of claim 1 wherein the first electrode and the second electrode set are positioned on the probe body and the substrate is grounded.

6. The probe system of claim 1 wherein the first electrode and the second electrode set are positioned on the substrate and the probe body is grounded.

7. A method of actuating a probe tip, the method comprising:
    providing a probe system, the probe system comprising:
        a probe body comprising four arms equally spaced apart and extending from the central region;
        a probe tip centrally located on the probe body in the central region;
        a substrate proximate the probe body opposite the probe tip;
        a supporting mechanism for the probe body between the central region and the at least four arms;
        a first electrode positioned to provide a centrally positioned voltage across the probe body and the substrate; and
        a second electrode set positioned on each of the four arms, to provide an outer voltage across at least one of the at least three arms and the substrate;
    moving the probe tip toward a medium by applying a first voltage to a first electrode to provide voltage across the central region and an adjacent substrate; and
    moving the probe tip away from the medium by applying a second voltage to a second electrode set to provide voltage across at least one of the at least four arms and the adjacent substrate.

8. The method of claim 7 comprising:
    moving the probe tip away from the medium by applying a second voltage to a second electrode set to provide voltage across at least one of the four arms and the adjacent substrate.

9. The method of claim 8 wherein moving the probe tip away from the medium by applying a second voltage to a second electrode set to provide voltage across at least one of the four arms and the adjacent substrate comprises:
    moving the probe tip away from the medium by applying a second voltage to a second electrode set on the probe structure to provide voltage across at least one of the four arms and a grounded adjacent substrate.

10. The method of claim 8 wherein moving the probe tip away from the medium by applying a second voltage to a second electrode set to provide voltage across at least one of the four arms and the adjacent substrate comprises:
   moving the probe tip away from the medium by applying a second voltage to a second electrode set on the adjacent substrate to provide voltage across at least one of four grounded arms and the adjacent substrate.

11. The probe system of claim 1, wherein the voltage is provided across each one of the at least four arms.

* * * * *